US010310016B2

(12) United States Patent
Ottewill et al.

(10) Patent No.: US 10,310,016 B2
(45) Date of Patent: Jun. 4, 2019

(54) METHOD FOR THE DIAGNOSTICS OF ELECTROMECHANICAL SYSTEM BASED ON IMPEDANCE ANALYSIS

(71) Applicant: ABB TECHNOLOGY AG, Zurich (CH)

(72) Inventors: James Ottewill, Middlesex (GB); Maciej Orman, Radziszow (PL); Cajetan Pinto, Mumbai (IN)

(73) Assignee: ABB TECHNOLOGY AG, Zurich (CH)

( * ) Notice: Subject to any disclaimer, the term of this patent is extended or adjusted under 35 U.S.C. 154(b) by 701 days.

(21) Appl. No.: 14/437,864

(22) PCT Filed: Oct. 8, 2013

(86) PCT No.: PCT/EP2013/003019
§ 371 (c)(1),
(2) Date: Apr. 23, 2015

(87) PCT Pub. No.: WO2014/063784
PCT Pub. Date: May 1, 2014

(65) Prior Publication Data
US 2015/0293177 A1    Oct. 15, 2015

(30) Foreign Application Priority Data
Oct. 26, 2012    (EP) .................................. 12460078

(51) Int. Cl.
*G01R 31/00*    (2006.01)
*G01R 31/34*    (2006.01)
(Continued)

(52) U.S. Cl.
CPC ..... *G01R 31/343* (2013.01); *G01R 19/16528* (2013.01); *G01R 31/06* (2013.01)

(58) Field of Classification Search
CPC . G01R 31/343; G01R 19/16528; G01R 31/06
(Continued)

(56) References Cited

U.S. PATENT DOCUMENTS 6,035,265 A    3/2000  Dister et al. .................. 702/183
6,323,658 B1  11/2001  Kendig et al. ................ 324/551
(Continued)

OTHER PUBLICATIONS

*Induction motor eccentricity diagnosis using impedance spectrum and shaft voltage*; Rogozin et al.; Electrical Machines (ICEM); 2010 XIX International Conference, IEEE; Piscataway, NJ, USA; Sep. 6, 2010; pp. 1-3.
(Continued)

*Primary Examiner* — Huan Hoang
(74) *Attorney, Agent, or Firm* — Renner Kenner Greive Bobak Taylor & Weber (57) ABSTRACT

The present invention is concerned with a method for diagnosing the state of electromechanical systems in which electrical rotating machinery is used on the basis of analysis of impedance estimated from at least two currents and two voltages, measured during an operation of the electromechanical system. The method may be especially useful in the condition monitoring of electric motors and generators. The invention combines the information from both the voltage and current signals measurable at the motor terminals. Specifically, the measurements of voltage and current from two or more phases of a polyphase electrical machine are combined to estimate the impedance of the machine, impedance being the resistance to the flow of current that a circuit exhibits when a voltage is applied to it.

5 Claims, 4 Drawing Sheets (51) Int. Cl.
 *G01R 19/165* (2006.01)
 *G01R 31/06* (2006.01)
(58) Field of Classification Search
 USPC .......................................................... 702/58
 See application file for complete search history.

(56) References Cited

U.S. PATENT DOCUMENTS

| | | | |
|---|---|---|---|
| 2002/0167300 A1* | 11/2002 | Kim | H02M 7/53871 |
| | | | 324/107 |
| 2007/0282548 A1 | 12/2007 | Ling et al. | 702/65 |
| 2010/0169030 A1* | 7/2010 | Parlos | G01H 1/00 |
| | | | 702/58 |
| 2010/0301792 A1 | 12/2010 | Tiwari et al. | 318/490 |
| 2014/0035502 A1* | 2/2014 | Wang | H02K 29/12 |
| | | | 318/400.37 |

OTHER PUBLICATIONS

International Search Report dated Nov. 18, 2013 in corresponding application No. PCT/EP2013/003019.
Written Opinion dated Nov. 18, 2013 in corresponding application No. PCT/EP2013/003019.

* cited by examiner

METHOD FOR THE DIAGNOSTICS OF ELECTROMECHANICAL SYSTEM BASED ON IMPEDANCE ANALYSIS

CROSS-REFERENCE TO RELATED APPLICATION

This is a § 371 application of International patent application number PCT/EP2013/003019 filed Oct. 8, 2013, which claims the benefit of European patent application No. 12460078.4 filed on Oct. 26, 2012, and which are incorporated herein by reference.

TECHNICAL FIELD

The present invention is concerned with a method for diagnosing the state of electromechanical systems in which electrical rotating machinery is used on the basis of analysis of impedance estimated from current and voltage, measured during an operation of the electromechanical system. The method may be especially useful in the condition monitoring of electric motors and generators.

BACKGROUND OF THE INVENTION

Ongoing design improvements are leading to increasing reliability, robustness and most importantly, greater efficiency of electrical rotating machinery. Coupled with improvements in the methods of controlling these machines, these design changes have led to the increasing usage of electric motors and generators in rotating machinery. In parallel with the increasing relevance of electrical rotating machinery, has been the development of more considered approaches of monitoring the condition of motors and generators. Typically, the health of these machines has been evaluated on the basis of measured temperatures and vibrations.

Recently, the analysis of stator winding currents, typically measured from the power cables connecting the electrical rotating machines to the power source has been grown in recognition as a method for identifying the condition of electrical machines, as well as some certain other components which form part of the shaft line. Spectral analysis of these measured stator winding currents, more typically known as Motor Current Signature Analysis (MCSA), represents a widely adopted method of analyzing the health of electrical rotating machinery using signals measured from power cables. Faults in the electrical machine result in load variations as well as variations in the size of the air-gap between the rotor and the stator. Both of these variations serve to modulate the large alternating current (AC) power supply currents, resulting in sidebands of the supply frequency to be visible in the frequency spectrum of the current. Specific fault modes may be related to specific frequencies in the current spectrum; hence it is possible to identify the type and severity of a fault in an electrical machine.

There are various advantages of MCSA. In addition to being comparatively cheap to implement, there are inherent advantages associated with directly measuring signals from the power cables connecting the electrical rotating machines to the power source. Firstly, current and voltage sensors may be considered as non-invasive as the electric rotating machine forms part of the electromechanical system. Secondly, transmission path effects associated with the location of the transducer relative to a fault are less severe.

Whilst MCSA represents a powerful tool, it is not without its limitations. An often undisclosed assumption in this analysis is that the phase voltages supplied to the electric machine are idealized sinusoids that are not influenced by the condition of the machine. In reality, back electromagnetic forces (EMFs) generated in a machine are likely to differ between faulty and healthy machines, and hence the voltages measured at the motor terminals are likely to include some dynamic signatures which may be interrogated for diagnostic information. Whilst it is true that in the case of a machine supplied direct-on-line the dynamic signatures in current signals are much more easily discerned than the equivalent signatures in the voltage, it is also true that by neglecting voltage measurements, some information relevant for condition monitoring is also neglected. This situation is particularly relevant in the case of electrical machines which are supplied by a drive, where controller actions can act to transfer information from the current signals to the voltage supplied to the machine. Thus, methods that combine both currents and voltages measured from power cables connecting the electrical rotating machines to the power source can ensure that no potentially useful diagnostic information is ignored. An example of such a method is the analysis of electromagnetic torques estimated on the basis of measured currents and voltages. However, methods of estimating the torque of a machine require accurate estimates of machine parameter values such as the stator resistance. Such values are not always easily available and their accurate estimation is non-trivial.

Measured currents and voltages may be combined to obtain the admittance or impedance of the electric machine, which in turn may be analyzed to identify the health of the machine. US patent description US2007/0282548A, describes a method for determining conditions of mechanical system driven by a motor by monitoring an admittance or impedance at an input to the motor over a period of time. The admittance or impedance is calculated using current and voltage measurements. Variation in admittance or impedance is associated with known conditions including faults. Whereas US patent description US2007/0282548A describes a method of deriving and analyzing the admittance or impedance of a single supply phase, it is often the case that a greater amount of diagnostic information may be obtained by comparing the differences between the separate phases of a polyphase rotating electrical machine. An example of where this approach may prove to be a limitation is in the case of diagnosing static eccentricity in a three-phase electrical machine. In this situation, whilst certain characteristics of the impedance estimated from currents and voltages measured from two of the three phases will differ from the equivalent impedance estimates from a healthy machine, in the third phase the difference between the impedance estimated in the healthy case and in the case with static eccentricity may be negligible. As a result, there is a risk of monitoring approaches based upon impedance estimated from currents and voltages measured from only one phase of an electrical machine being insensitive to certain developing faults, with the potential for many missed alarms

SUMMARY OF THE INVENTION

As opposed to discarding the information available at the motor terminals, the invention combines the information from both the voltage and current signals measurable at the motor terminals. Specifically, the measurements of voltage and current from two or more phases of a polyphase electrical machine are combined to estimate the impedance of the machine, impedance being the resistance to the flow of current that a circuit exhibits when a voltage is applied to it. The presented invention has many advantages over existing condition monitoring methods related to analysis of impedance or admittance known in the state of the art. Primarily by comparing the impedance estimated from each phase of a polyphase rotating electrical machine, the invention significantly reduces the probability of missed alarms.

A method according to the invention comprises the steps of:
  measuring at least two phase currents and two phase voltages for the same respective phases supplying the rotating machine,
  processing the measured values using a computer processing device adapted to transform the measured values from the time domain to the frequency domain, creating voltage spectrum signals $V1_F, V2_F, V3_F, \ldots Vn_F$ and current spectrum signals $I1_F, I2_F, I3_F, \ldots In_F$,
  processing the current spectrum signals $I1_F, I2_F, I3_F, \ldots In_F$ to obtain the inverted current spectra $I1_{F,inv}, I2_{F,inv}, I3_{F,inv}, \ldots In_{F,inv}$,
  processing the inverted current spectra $I1_{F,inv}, I2_{F,inv}, I3_{F,inv}, \ldots In_{F,inv}$ to obtain the impedance spectrum signals $Y1_F, Y2_F, Y3_F, \ldots Yn_F$ of the rotating machine,
  extracting a vector of amplitudes at frequencies of interest from the impedance spectrum signals which are needed to diagnose the electromechanical system,
  calculating the maximum value of the difference between the amplitudes at frequencies of interest extracted from the impedance spectrum signals,
  comparing maximum value of the difference between the amplitudes at frequencies of interest extracted from the impedance spectrum signals with a threshold which is given as a limit,
  indicating an alarm to the user when the limit is exceed.

Preferably the vector of amplitudes at frequency of interest is a third harmonic of the supply frequency.

Preferably the vector of amplitudes at frequency of interest indicate the presence of an eccentricity in the electromechanical system.

A system according to the invention comprising means for measuring at least two phase currents and two phase voltages for the same respective phases supplying the rotating machine, means for processing the measured values and for creating impedance spectrum signals $Y1_F, Y2_F, Y3_F, \ldots Yn_F$ of the rotating machine, means for extracting data of interest from the impedance spectrum signals, means for indicating an alarm to the user that is characterized in that it has means for calculating the maximum value of the difference between the amplitudes at frequencies of interest extracted from the impedance spectrum signals and for comparing maximum value of the difference between the amplitudes at frequencies of interest extracted from the impedance spectrum signals with a threshold which is given as a limit.

Preferably the rotating machinery in the electromechanical system is motor or generator.

A computer program product which is loadable into the computer measuring device characterized in that during a program run it executes the method according to claims 1-5.

BRIEF DESCRIPTION OF THE DRAWINGS

The subject of the invention is presented as an embodiment in the following drawings.

DETAILED DESCRIPTION OF THE INVENTION

Figure 1:
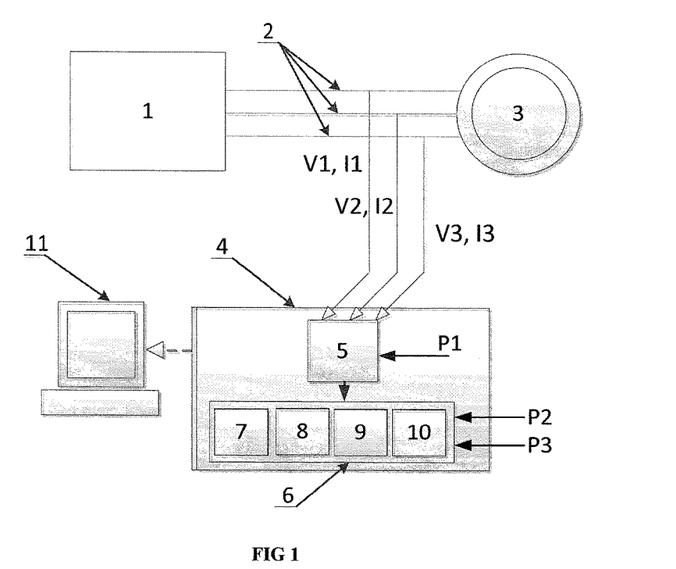
FIG. 1 shows a block diagram of the system for the realization of the invention.
Figure 2:
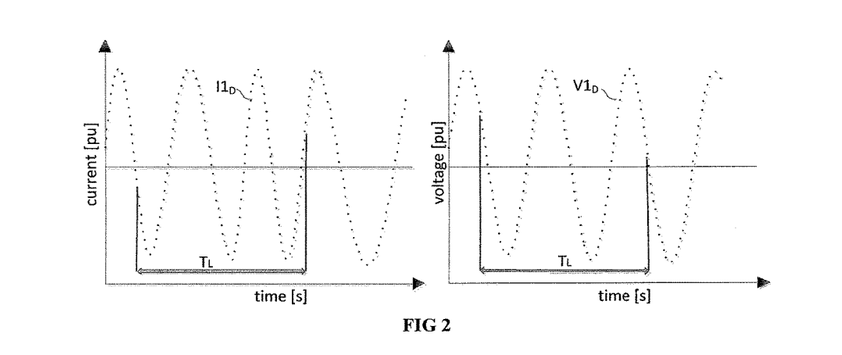
FIG. 2—a diagram of a discrete voltage signal V1 and discrete current signal I1 for one phase, FIG. 3—a diagram of voltage spectrum signals $V1_F$ and current spectrum signals $I1_F$ for one phase, FIG. 4—a diagram of inverted current spectra $I1_{F,inv}, I2_{F,inv}, I3_{F,inv}$.

The measuring system for the realization of the method according to the invention is connected to a three-phase source of alternating current supply 1 connected with an rotating electrical motor 3 by supply cables 2. In the presented embodiment of the invention, the source of alternating current supply 1 is three-phase, however, although it is not presented in the drawing, it will be understood by those skilled in the state of the art that the described invention may also be applied to electrical rotating machines supplied by a polyphase supply.

The supply cables 2 are connected with a measuring device 4 containing an analog to digital converter 5 which is connected with a computer processing device 6 containing a processor 7 and a processing module 8 for calculating an impedance and processing an impedance spectrum signals, an analyzer module 9 for analyze the data received from impedance spectrum signals and a data storage module 10, which are suitable for the realization of the method according to the invention. The computer processing device 6, through the measuring device 4, is coupled with a device 11 for visualizing the results obtained by executing the inventive method. In the presented embodiment of the invention, the measuring device 4 is integrated with the computer device 6, but the measuring device and the computer device may be separate devices, which are not shown in the drawing. In such case the device 11 for visualizing the results is directly or remotely connected with the computer device 6.

Figure 7:
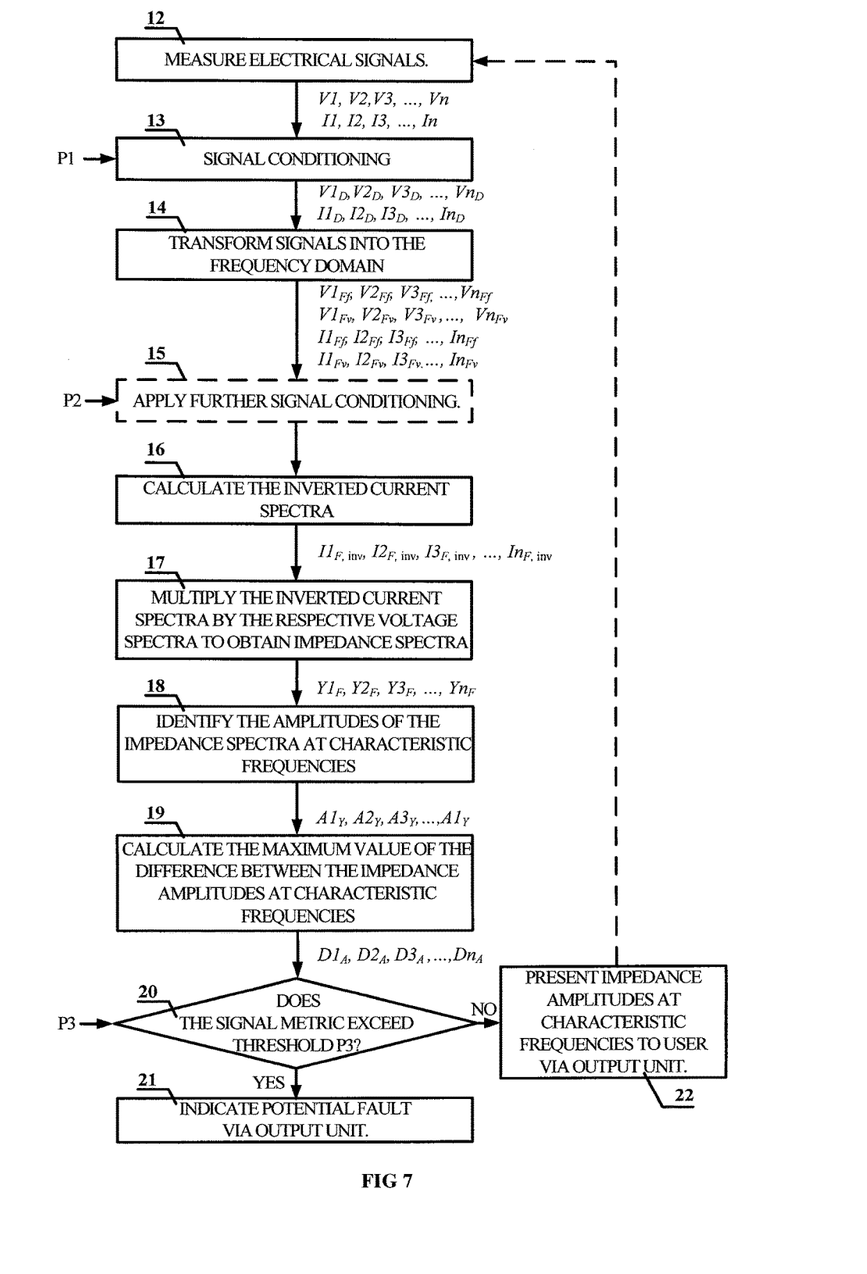
FIG. 7—a flowchart of operations performed while diagnosing an electro mechanical system.

The inventive method is implemented according to the following steps 12-22 shown in FIG. 7.

Step 12

With reference to the electromechanical network shown in FIG. 1, in step 12 the analog voltage signals V1, V2, V3, . . . , Vn and respective analog current signals I1, I2, I3, . . . , In of the alternating current that supplies the stator winding, where n is the number of phases of the rotating electrical machine 3 that are measured, which must be greater than 1. A typical embodiment will be that three phases (n=3) of analog voltage signals and respective analog current signals are measured. For clarity, the following describes this typical embodiment with n=3 phases considered, though those skilled in the state of the art will recognize that other values of n may equally be considered.

Step 13

At least two of the resulting measured analog voltage signals V1, V2, V3 and at least two of the analog current signals I1, I2, I3, where the measured analog current signals, I1, I2, I3 and the measured analog voltage signals V1, V2, V3 are of the same respective phase, are converted to discrete voltage signals $V1_D, V2_D, V3_D$ and respective discrete current signals $I1_D, I2_D, I3_D$ in an analog to digital converter 5, to which constant parameters P1 are supplied. Parameters P1 characterize the process of conversion of analog signals to discrete signals, being comprised of the sampling rate $F_S$ given by the user and the length of the signal $T_L$ subject to conversion given by the user. The sampling rate $F_S$ defines the number of samples per second taken from the analog voltage signals V1, V2, V3 and analog current signals I1, I2, I3. Usually the minimum sampling rate is 1 kHz and this is the default setting. The length of the signal $T_L$ defines the length of the analog voltage signals V1, V2, V3 and analog current signals I1, I2, I3 taken for analog to digital conversion. In the embodiment of the inventive method the minimum value of the signal length $T_L$ is 1 s.

The obtained discrete voltage signals $V1_D$, $V2_D$, $V3_D$ and discrete current signals $I1_D$, $I2_D$, $I3_D$ are automatically transmitted to the processing module 8 implementing in the computer device 6.

Step 14

Figure 3:
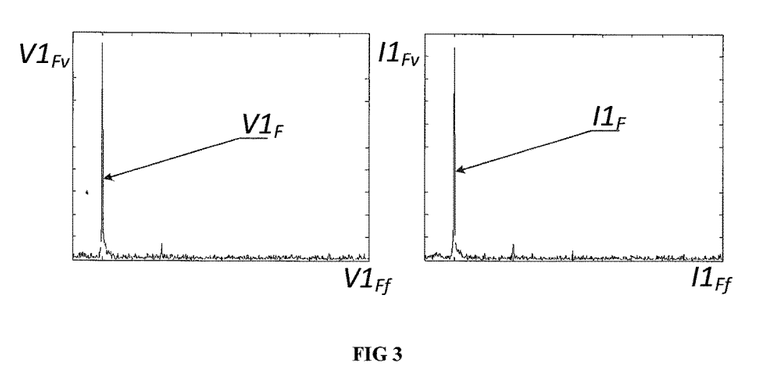

In this step, the discrete voltage signals $V1_D$, $V2_D$, $V3_D$ and discrete current signals $I1_D$, $I2_D$, $I3_D$ are transformed by the calculation of the DFT (Discrete Fourier Transform). The DFT operation transforms the signal from the time domain into a signal in the frequency domain allowing spectral analysis to be performed; the details of such calculation including algorithms used to compute the DFT, such as the Fast Fourier Transform, are well known to those skilled in the art. The resulting DFT may also be converted into the logarithmic scale relative to the maximum value in the DFT, which typically relates to the supply frequency, using methods well known to those skilled in the art. The supply frequency is typically equal to the line frequency for machines supplied direct on-line, or to frequencies related to the speed set point for machines supplied by electrical drives. After transformation, the discrete voltage signals $V1_D$, $V2_D$, $V3_D$ and discrete current signals $I1_D$, $I2_D$, $I3_D$ form voltage spectrum signals $V1_F$, $V2_F$, $V3_F$ and current spectrum signals $I1_F$, $I2_F$, $I3_F$, respectively. The voltage spectrum signals $V1_F$, $V2_F$, $V3_F$ and current spectrum signals $I1_F$, $I2_F$, $I3_F$ contain respective voltage vectors of frequency $V1_{Ff}$, $V2_{Ff}$, $V3_{Ff}$ and values $V1_{Fv}$, $V2_{Fv}$, $V3_{Fv}$ for case of voltage spectrum signals $V1_F$, $V2_F$, $V3_F$ and current vectors of frequency $I1_{Ff}$, $I2_{Ff}$, $I3_{Ff}$ and values $I1_{Fv}$, $I2_{Fv}$, $I3_{Fv}$ for case of current spectrum signals $I1_F$, $I2_F$, $I3_F$ as it is shown in FIG. 3 for the example of phase 1.

Step 15

Prior to calculating the impedance spectrum signals $Y1_F$, $Y2_F$, $Y3_F$ it is typically necessary to perform some minor signal conditioning to ensure the usability of the resulting impedance spectrum signals $Y1_F$, $Y2_F$, $Y3_F$ In order to reduce the influence of the supply frequency, which dominates the current spectrum signals $I1_F$, $I2_F$, $I3_F$, it is typically necessary to apply a band-pass or notch filter to remove the supply frequency using peak identification and filtering methods known in the state of the art. Furthermore, once inverted, low amplitude components of the current spectrum signals $I1_F$, $I2_F$, $I3_F$ may dominate the impedance spectrum signals $Y1_F$, $Y2_F$, $Y3_F$. To ensure the impedance spectrum signals $Y1_F$, $Y2_F$, $Y3_F$ will contain as much information as possible, it is also usually necessary to set values of the current spectrum signals $I1_F$, $I2_F$, $I3_F$ whose amplitude is below a threshold predefined by the user to be equal to that threshold. The threshold value is supplied to this step as parameter set P2. A typical value of the threshold value is 1% of the maximum amplitude of the current spectrum signals $I1_F$, $I2_F$, $I3_F$ and this is the default value. After performing the minor signal conditioning actions, the conditioned current spectrum signals $I1_{F,con}$, $I2_{F,con}$, $I3_{F,con}$ are obtained. Those skilled in the state of the art will know that the additional signal conditioning is a discretionary step aimed at improving the quality of the information contained within the impedance spectrum signals $Y1_F$, $Y2_F$, $Y3_F$ using methods known in the state of the art, and that under certain conditions this additional conditioning may be omitted from the inventive method, as indicated in FIG. 7 by dashed lines.

Step 16

In this step inverted current spectrum signals $I1_{F,inv}$, $I2_{F,inv}$, $I3_{F,inv}$ are calculated. The inverted current spectrum signals $I1_{F,inv}$, $I2_{F,inv}$, $I3_{F,inv}$ may be calculated using the formula:

$$\left.\begin{aligned} I1_{F,inv} &= \frac{1}{I1_{F,con}} \\ I2_{F,inv} &= \frac{1}{I2_{F,con}} \\ I3_{F,inv} &= \frac{1}{I3_{F,con}} \end{aligned}\right\} \quad (1)$$

Figure 4:
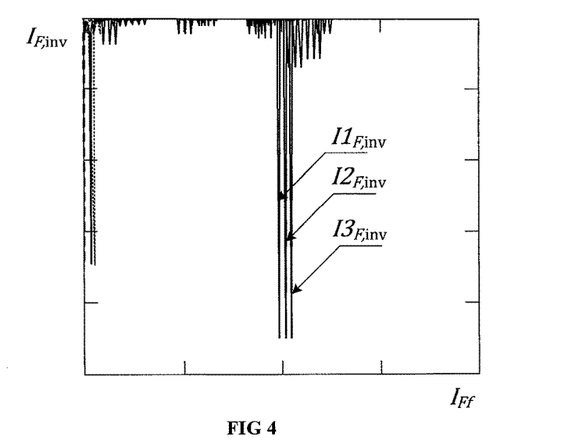

FIG. 4 shows the inverted current spectrum signals $I1_{F,inv}$, $I2_{F,inv}$, $I3_{F,inv}$, obtained after removing the supply frequency and low amplitude components of the current spectrum signals $I1_F$, $I2_F$, $I3_F$.

Step 17

The impedance spectrum signals $Y1_F$, $Y2_F$, $Y3_F$ contains impedance vectors of frequency $Y1_{Ff}$, $Y2_{Ff}$, $Y3_{Ff}$ and impedance amplitude values $Y1_{Fv}$, $Y2_{Fv}$, $Y3_{Fv}$. The impedance vectors of frequency $Y1_{Ff}$, $Y2_{Ff}$, $Y3_{Ff}$ which is the same as voltage vectors of frequency $V1_{Ff}$, $V2_{Ff}$, $V3_{Ff}$ or current vectors of frequency $I1_{Ff}$, $I2_{Ff}$, $I3_{Ff}$. The impedance amplitude values $Y1_{Fv}$, $Y2_{Fv}$, $Y3_{Fv}$ are calculated using the formula:

$$\left.\begin{aligned} Y1_{Fv} &= V1_{Fv} I1_{F,inv} \\ Y2_{Fv} &= V2_{Fv} I2_{F,inv} \\ Y3_{Fv} &= V3_{Fv} I3_{F,inv} \end{aligned}\right\} \quad (2)$$

Where $I1_{F,inv}$, $I2_{F,inv}$, $I3_{F,inv}$ were calculated in step 16.

The impedance is a measure of the opposition to the flow of current that a particular circuit has when a voltage is applied to it. In an electric motor, the impedance of a single supply phase may be time-varying in response to the dynamics of the system, specifically changes in size of the air-gap or a change in the rotor or stator magnetic flux. The impedance spectrum signals $Y1_F$, $Y2_F$, $Y3_F$ indicate the frequency content of the impedance. The result of step 17 is the impedance spectrum signals $Y1_F$, $Y2_F$, $Y3_F$ presented on FIG. 5.

Step 18

Once the impedance of the three supply phases have been calculated, the impedance spectrum signals $Y1_F$, $Y2_F$, $Y3_F$ are analyzed in the module 9 in order to extract information related to the condition of the rotating electrical machine. Asymmetries in a machine, caused by faults such as eccentricity will result in differences in the impedance values between each phase. Therefore a fault will cause an increase in the overall level of the impedance spectrum at a certain frequency as well as discrepancy between the three phases. The increase in level acts to emphasize the difference between the phases. Typically, the impedance spectrum signals $Y1_F$, $Y2_F$, $Y3_F$ contain characteristic components at frequencies related to the supply frequency and the frequency of rotation. The impedance amplitude values $Y1_{F_V}$, $Y2_{F_V}$, $Y3_{F_V}$ at these characteristic frequencies relate to the severity of specific fault types.

Figure 5:
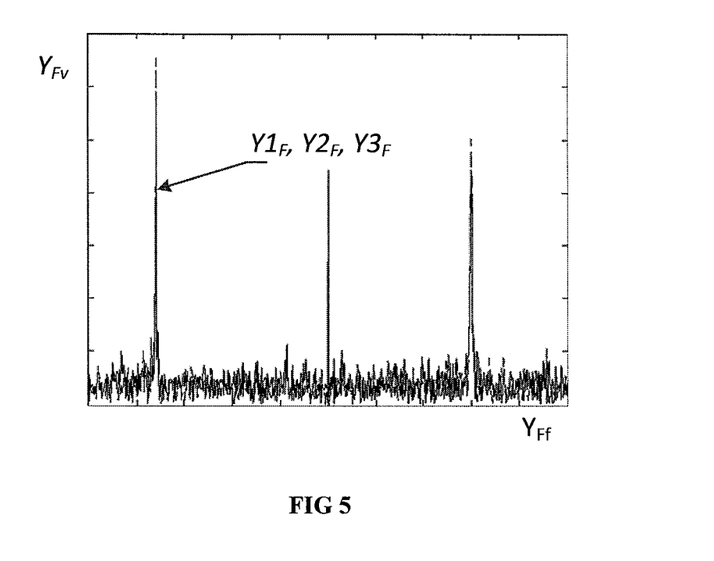
FIG. 5—a diagram of the fragment of impedance spectrum for three phases.
Figure 6:
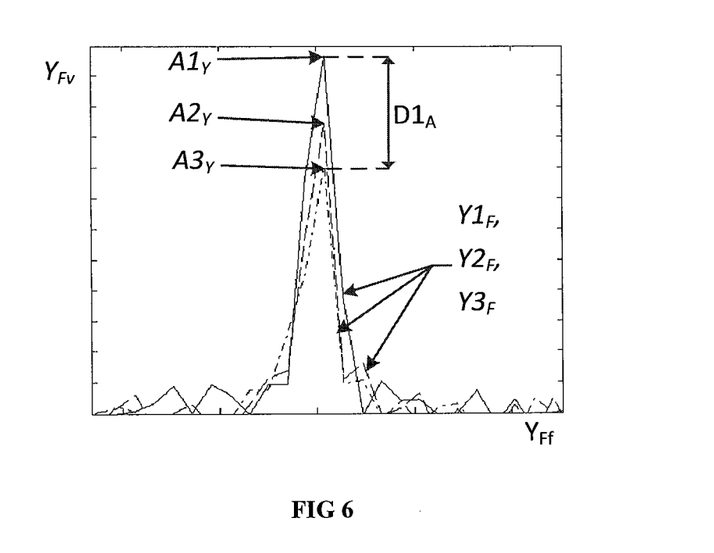
FIG. 6—a zoom in into a fragment of impedance spectrum from FIG. 5

In the exemplary embodiment of the invention, a case of eccentricity of faulty motor was examined. The eccentricity was not detectable based only on analysis of current measurements. In FIG. 5 there is fragment of impedance spectrum signals $Y1_F$, $Y2_F$, $Y3_F$ three phases. As it is zoomed (FIG. 6) into frequencies of interest, where in this case it is the $3^{rd}$ harmonic of line frequency, it is possible to notice that there are relatively large differences between impedance phase amplitudes. Those who are skilled in the state of the art will recognize that faults other than eccentricity may be identified and quantified by identifying impedance amplitude values $Y1_{F_V}$, $Y2_{F_V}$, $Y3_{F_V}$ at characteristic frequencies, other than the $3^{rd}$ harmonic of line frequency.

The results of this step are impedance amplitudes $A1_Y$, $A2_Y$, $A3_Y$ at the frequency of interest of each of the phases selected at Step 12.

Step 19

In this step the difference between each of the impedance amplitudes $A1_Y$, $A2_Y$, $A3_Y$ at the frequency of interest of each phases selected at Step 12 is calculated. This is achieved by performing an all-pairs test or pairwise test where the difference between all possible pairs of values in the impedance amplitudes $A1_Y$, $A2_Y$, $A3_Y$ at the frequency of interest of each phase selected at Step 12 is calculated by simple subtraction. The result of this operation is the difference between amplitudes $D1_A$, $D2_A$, $D3_A$ of the phases of impedance at the frequency of interest.

Step 20

In this step the value of the maximum value of the difference between amplitudes $D1_A$, $D2_A$, $D3_A$ of the phases of impedance at the frequency of interest is compared with a threshold value. The threshold value is given to this step as a parameter P3. A typical threshold value is ten percent of the maximum value of the impedance spectrum, and this value is set as the default value. It will be known to those skilled in the state of the art that threshold values may be tuned in accordance with empirical evidence or on the basis of models of the electromechanical systems.

If the maximum value of the difference between amplitudes $D1_A$, $D2_A$, $D3_A$ of the phases of impedance at the frequency of interest is greater than the predefined threshold P3 then an alarm may be initiated and a fault may be indicated to the end-user using techniques known in the state of the art, for example via a simple visual user interface on a monitor, or via SMS text message.

In the described embodiment a method for diagnosing eccentricity problems using the impedance spectra is given, however it should be noted that the method is applicable to diagnosing a wide range of defects, simply by analyzing the impedance spectra at different frequencies of interest.

Step 21

At step 21 the impedance amplitudes $A1_Y$, $A2_Y$, $A3_Y$ at the frequency of interest of each phases and the warning obtained in step 20 are automatically supplied to the user, via the output unit 11 using known methods.

Step 22

At step 22 the impedance amplitudes $A1_Y$, $A2_Y$, $A3_Y$ are automatically supplied to the user, via the output unit 11 using known methods. Additionally, the inventive method may optionally be restarted at step 12, as indicated in FIG. 7 via a dotted line connecting Step 22 to Step 12.

What is claimed is:

1. A method for monitoring a condition of an electromechanical system in which an electrical rotating machine is used to measure currents and voltages of more than one phase to be more sensitive to and prevent insensitivity to developing faults, comprising the steps of:

providing an electrical rotating machine supplied with electrical power by alternating current supply cables;

connecting a measuring device with an analog to digital convertor to said alternating current supply cables;

measuring at least two phase currents and two phase voltages for the same respective phases supplying the electrical rotating machine with said analog to digital convertor;

processing the measured phase currents and phase voltage values using a computer processing device connected to said analog to digital convertor, wherein said computer processing device contains a processor and a processing module which are adapted to transform the measured phase current and phase voltage values from the time domain to the frequency domain, creating voltage spectrum signals $V1_F$, $V2_F$, $V3_F$, ... $Vn_F$ and current spectrum signals $I1_F$, $I2_F$, $I3_F$, ... $In_F$;

processing in said computer processing device the current spectrum signals $I1_F$, $I2_F$, $I3_F$, ... $In_F$ to obtain an inverted current spectra $I1_{F,inv}$, $I2_{F,inv}$, $I3_{F,inv}$, ... $In_{F,inv}$;

processing in said computer processing device the inverted current spectra $I1_{F,inv}$, $I2_{F,inv}$, $I3_{F,inv}$, ... $In_{F,inv}$ to obtain impedance spectrum signals $Y1_F$, $Y2_F$, $Y3_F$, ... $Yn_F$ of the rotating machine;

extracting a vector of amplitudes at frequencies of interest from the impedance spectrum signals with an analyzer contained in said computer processing device which are needed to diagnose the electromechanical system;

calculating a maximum value of a difference between the amplitudes at frequencies of interest extracted from the impedance spectrum signals in said computer processing device;

comparing a maximum value of the difference between the amplitudes at frequencies of interest extracted from the impedance spectrum signals with a threshold which is given as a limit in said computer processing device so as to reduce the possibility of missed alarms; and indicating an alarm to the user when the limit is exceeded.

2. A method according to claim 1, characterized in that the vector of amplitudes frequency of interest is a third harmonic of a supply frequency on said alternating current supply cables.

3. A method according to claim 2, characterized in that the vector of amplitudes at frequency of interest indicate the presence of an eccentricity in the electromechanical system.

4. A method according to claim 1 characterized in that the electrical rotating machine in the electromechanical system is a motor or a generator.

5. A system for monitoring a condition of an electromechanical system in which electrical rotating machinery is used to detect development of electrical faults in the electromechanical system by measuring currents and voltages of more than one phase to be more sensitive to and prevent insensitivity to developing faults, the system comprising:

an electrical rotating machine supplied with electrical power by alternating current supply cables;

means for measuring at least two phase currents and two phase voltages for the same respective phases supplying a rotating machine, wherein said means for measuring includes an analog to digital convertor connected to said alternating current supply cables;

a computer processing device that receives the measured phase current and phase voltage values and calculates impedance spectrum signals $Y1_F, Y2_F, Y3_F, \ldots Yn_F$ of the rotating machine;

an analyzer module for extracting data of interest from the impedance spectrum signals;

an alarm to indicate a fault to the user, wherein said computer processing device:
  calculates the maximum value of the difference between the amplitudes at frequencies of interest extracted from the impedance spectrum signals; and
  compares a maximum value of the difference between the amplitudes at frequencies of interest extracted from the impedance spectrum signals with a threshold which is given as a limit so as to reduce the possibility of missed alarms.

* * * * *